United States Patent [19]
Ito

[11] Patent Number: 5,601,653
[45] Date of Patent: Feb. 11, 1997

[54] APPARATUS FOR PERFORMING PLASMA PROCESS ON SEMICONDUCTOR WAFERS AND THE LIKE AND METHOD OF PERFORMING PLASMA PROCESS

[75] Inventor: Masao Ito, Kitakami, Japan

[73] Assignee: Kabushiki Kaisha Toshiba, Kawasaki, Japan

[21] Appl. No.: 235,656

[22] Filed: Apr. 29, 1994

[30] Foreign Application Priority Data

Apr. 30, 1993 [JP] Japan .................................. 5-104405
Apr. 19, 1994 [JP] Japan .................................. 6-080344

[51] Int. Cl.$^6$ .................................................. C23C 16/00
[52] U.S. Cl. ........................ 118/723 FE; 118/723 MP; 118/723 FI
[58] Field of Search ....................... 118/723 EB, 723 M, 118/723 MP, 723 FE, 723 FI; 204/298.37, 298.16; 156/345; 315/111.61, 111.81; 313/231.37

[56] References Cited

U.S. PATENT DOCUMENTS

| 5,397,956 | 3/1995 | Araki et al. | 313/231.37 |
| 5,413,663 | 5/1995 | Shimizu et al. | 156/345 |

FOREIGN PATENT DOCUMENTS

| 59-27499 | 2/1984 | Japan . |
| 2-254159 | 10/1990 | Japan . |
| 4-191380 | 7/1992 | Japan . |
| 4-289162 | 10/1992 | Japan . |
| 5-062625 | 3/1993 | Japan . |

OTHER PUBLICATIONS

"Reactive Ion Beam Etching Using a Broad Beam ECR Ion Source", Matsuo et al., Japanese Journal of Applied Physics, 21(1):L4–L6 (1982).

"Reactive Ion Beam Etching of $SiO_2$ and Poly–Si Empolying $C_2F_6$, $SiF_4$ and $BF_3$ Gases", Okano et al., Japanese Journal of Applied Physics, 21(5):696–701 (1982).

"New high current low energy ion source", Hara et al., J. Vac. Sci. Technol., B5(1):366–368 (1987).

"High–rate ion etching of GaAs and Si at low ion energy by using an electron beam excited plasma system", Yu et al., J. Vac. Sci. Technol., B6(6):1626–1631 (1988).

Primary Examiner—R. Bruce Breneman
Assistant Examiner—Joni Y. Chang
Attorney, Agent, or Firm—Finnegan, Henderson, Farabow, Garrett & Dunner, L.L.P.

[57] ABSTRACT

A plasma processing apparatus for performing plasma process on a semiconductor or the like draws an electron beam from an electron source plasma and, after acceleration, introduces the electron beam into a reaction chamber where a requisite gas is supplied for performing plasma process on the semiconductor wafer. At least one pair of magnets are provided in the chamber with an electron beam path created therebetween. The electron beam is formed into a sheet-like configuration through a magnetic field created by the at least one pair of magnets. The at least one pair of magnets are positioned in an opposed relation to allow the semiconductor wafer to be subjected at a uniform rate to plasma process.

3 Claims, 10 Drawing Sheets

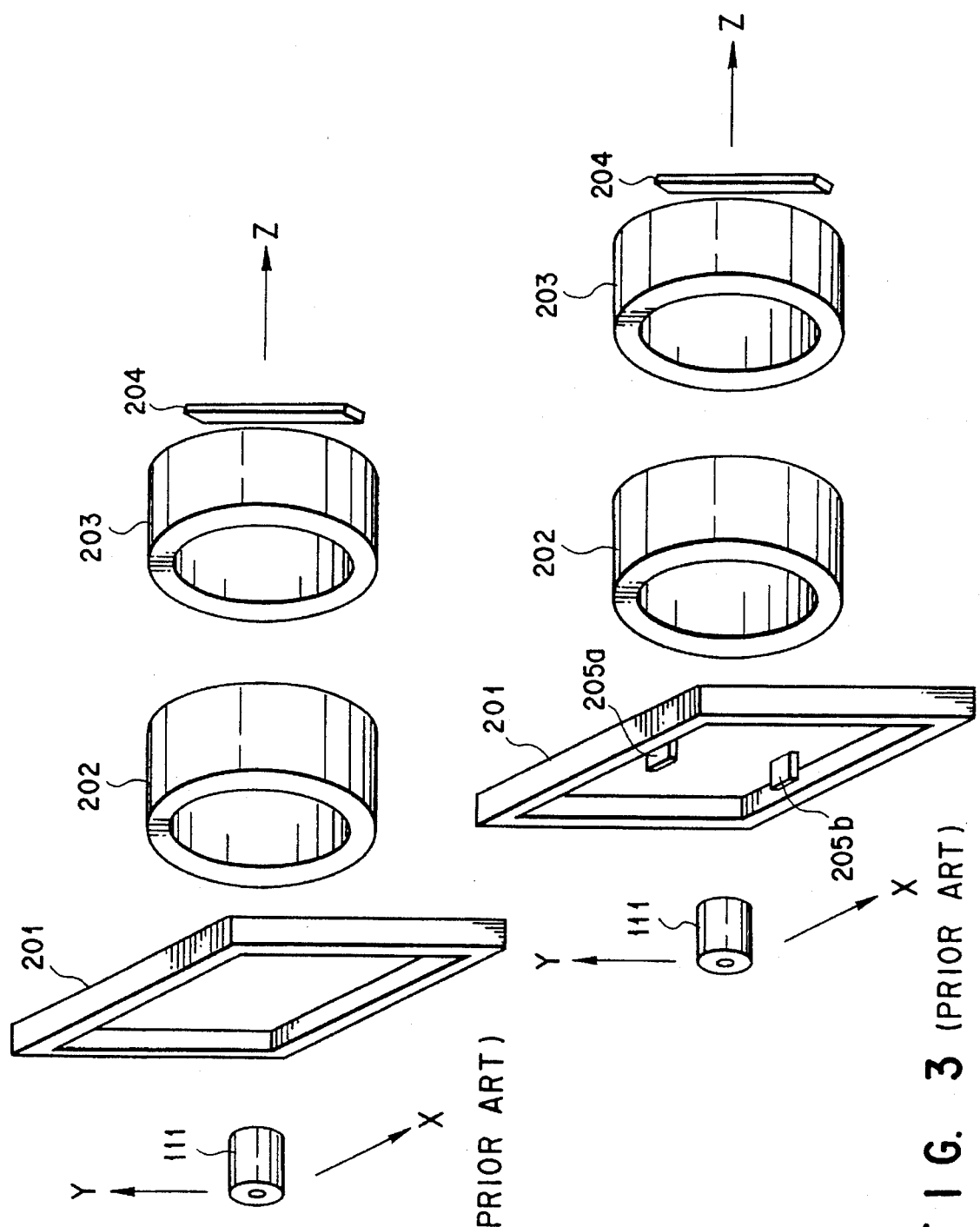

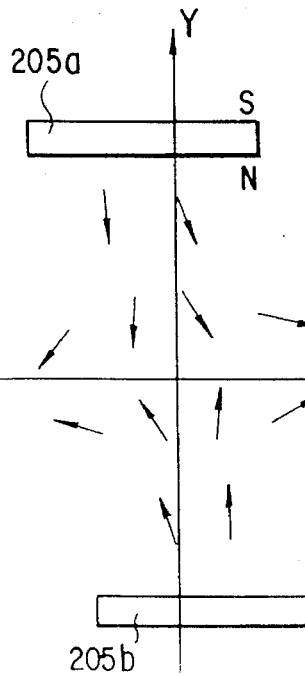
F I G. 16

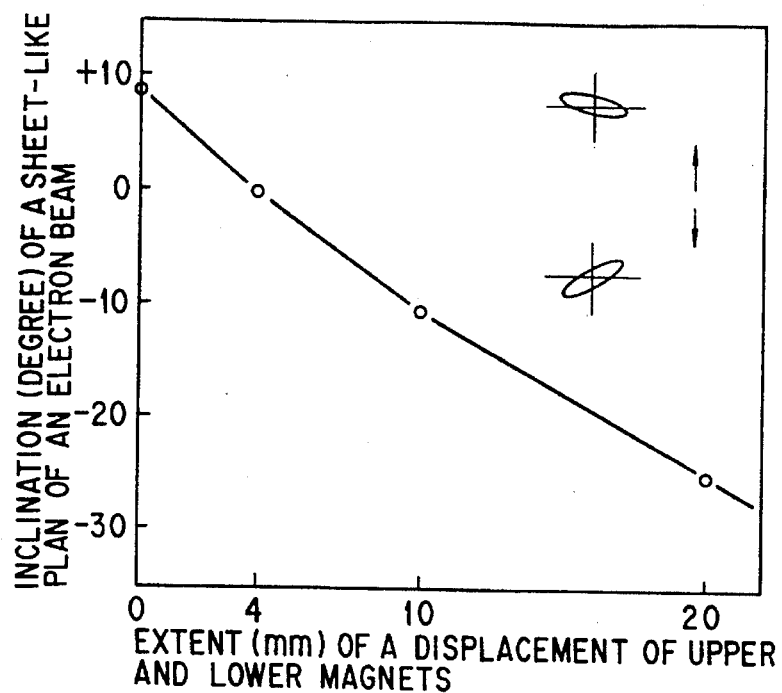
F I G. 17
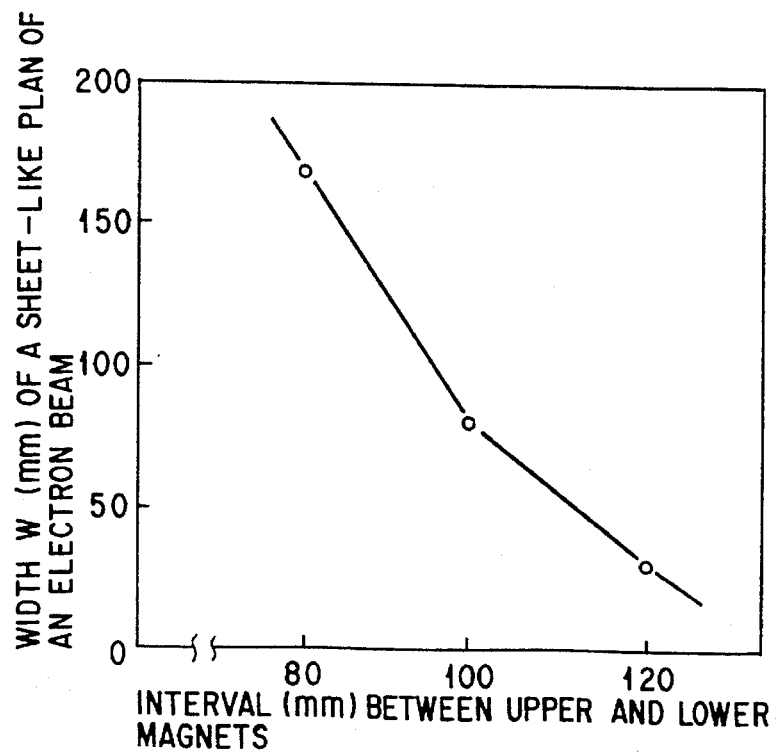
F I G. 18

APPARATUS FOR PERFORMING PLASMA PROCESS ON SEMICONDUCTOR WAFERS AND THE LIKE AND METHOD OF PERFORMING PLASMA PROCESS

BACKGROUND OF THE INVENTION

1. Field of the Invention

The present invention relates to an apparatus and method for performing process on a to-be-processed material, such as a semiconductor wafer, by a sheet-like plasma created through a reaction of a gas excited by an electron beam.

2. Description of the Related Art

In recent years, upon performing plasma process on a to-be-processed material, such as a semiconductor wafer, it has been necessary to perform a very fine process so that semiconductor devices can be manufactured as high-density units. For such very fine process to be achieved, it is necessary to set the directivity with which molecules reach the semiconductor wafer from a plasma created in a reaction chamber. For this reason, it is important to lower pressure in that reaction chamber in which the plasma is created, and to decrease a probability that the molecules in the reaction chamber will collide with each other.

If the pressure in the reaction chamber is simply reduced, then no plasma will be created due to a lowering in density of excited particles creating a plasma. A magnetron RIE method for accelerating the motion of electrons under a magnetic field so as to create a plasma even under a low pressure is disclosed, for example, in a document H. Okano and Y. Horiike: Jpn J. Appl. Phys. 21, 696 (1982) and an ECR method is disclosed in a document S. Matsuo and Y. Adachi: Jpn. J. Appl. Phys., 21, L4 (1982).

An Electron Beam Excited Plasma (EBEP) technique can generate a plasma even at a low pressure by continuously supplying electrons into a gas.

FIG. 1 diagrammatically shows one form of an apparatus for performing plasma process on a to-be-processed material, such as a semiconductor wafer, with the use of an EBEP technique as shown, for example, in the documents "T. Hara, M. Hamagaki, A, Sanda, Y, Aoyagi and S. Namba: J. Vac. Sci. Technol, 5, 366 (1987), J. Z. Yu, T. Hara, M. Hamagaki, T. Yoshinaga, Y. Aoyagi and S. Namba: J. Vac. Sci. technol, 6, 1626 (1988).

Such an apparatus for performing plasma process includes a chamber (hereinafter referred to as an electron source plasma creating chamber) 104 for creating a plasma, the chamber being located at one end side of a sealed container 100 and serving as an electron source. An electron beam acceleration chamber 112 is provided at an intermediate section of the sealed container 100. A reaction chamber 115 is provided on the other end side of the sealed container 10.

An inlet 101 for introducing an inert gas, such as Ar, electrodes 103, 105, 106 and 107 and electron beam-drawing annular coils 108, 109 and 110 are provided in the plasma creating chamber 104.

An annular coil 111 for guiding an electron beam 111, as well as an acceleration electrode 114 for accelerating the electron beam, is provided in the acceleration chamber 112.

A susceptor 116 is provided in the reaction chamber 115 to support a wafer 117 thereon and a gas inlet 118 is provided at the reaction chamber 115 to introduce a reaction gas therein.

A rectangular coil 201, solenoid coils 202, 203 and a samarium (Sm)-cobalt (Co)-based magnet 204 are arranged in proper places in the reaction chamber 115 as shown in FIG. 2.

Outlets 121, 122 and 123 are provided in the chambers 104, 112 and 115, respectively. The interiors of the respective chambers are evacuated by vacuum pumps to maintain these chambers at a required vaccum level.

An electrode 102 is connected to the electrode 103 to apply a required voltage Vd there. A switch 107a is connected to the electrode 105 to allow a selective connection to be made to a reference potential GND. A switch 107b is connected to the electrode 106 to allow a selective connection to be made to the reference potential GND. In the circuit as shown in FIG. 1, R1 to R4 designate resistors.

A power supply 113 is connected to the acceleration voltage 114 to apply a required acceleration voltage there. A power supply 119 is connected to the susceptor 116 to apply a required bias voltage Vt.

In the arrangement shown in FIG. 1, an electron source plasma is generated in the electron source plasma generation chamber 104. An electron beam is drawn from the electron source plasma and, being accelerated by the acceleration electrode 114, is introduced via the annular coil 111 into the reaction chamber 115.

In the reaction chamber 115, a gas introduced via the gas introducing inlet 118 is excited by an electron beam 120 to create a plasma through a reaction in the gas whereby it is possible to perform plasma process on a wafer 117.

In the above-mentioned apparatus thus constructed, however, if the electron beam thus introduced into the reaction chamber 115 is directly utilized, then the plasma becomes more dense along that area of the wafer where the electron beam is passed.

For this reason, if the apparatus is used in the vapor-phase growth (CVD) of a semiconductor device, in a dry-etching process, etc., a phenomenon occurs, such as the deposition speed and etching speed are fast at an area corresponding to the dense plasma area.

In order to prevent such phenomenon, research has been made into a method to uniformalize the density of a plasma. As one solution of this problem, permanent magnets 205a, 205b are employed with their N poles opposed to each other in a manner to define an electron beam path therebetween as shown in FIG. 3 whereby it is possible to set a sheet-like electron beam through a created magnetic field and hence to create a sheet-like plasma through the excitation of a gas by the electron beam in a reaction chamber. This method is disclosed, for example, in JPN PAT APPLN KOKAI PUBLICATION No. 59-27499.

If a semiconductor device is dry-etched through the utilization of such a sheet-like plasma, then the etching speed is made slower in a positive X-axis direction and faster in a negative X-axis direction as viewed in a direction of travel of the electron beam and an expected enhanced result cannot be obtained with respect to the uniformalization of etching.

Here, the X- and Y-axis represent a horizontal and a vertical direction relative to the wafer, respectively, and the Z-axis represents the direction in which the electron beam travels.

In order to investigate the causes for the different distribution of the etching speed in the positive X-axis and negative X-axis direction as set out above, simulation has been conducted on a large-scaled computer to see how electrons are mobilized under a magnetic field in the reaction chamber 115.

It has been found that the electron beam is configured to a sheet form through a mechanism as will be set out below, that is, on the wafer 117 supported on the susceptor 116 the sheet form of the electron beam 120 is tilted down in the positive X-axis direction and up in the negative X-axis direction, as shown in FIG. 4, as viewed in the Z-axis direction in which the electron beam travels.

FIGS. 5 and 6 are a front and a side diagrammatic view, respectively, where the electron beam is viewed in a direction of travel from the "inlet" side of the reaction chamber 115.

In the neighborhood of the inlet of the reaction chamber 115, that is, at that area as indicated by an arrow A in FIG. 6, a magnetic field is oriented by the annular coil 111 in the substantially Z-axis direction. In that area, the electrons are mobilized in the substantially Z-axis direction as in the case of the magnetic field and acquire those motion components, through collisions with other particles, other than the Z-axis component.

Given that the electrons acquire, for example, a motion component in the Y-axis direction, those electrons bearing a negative charge encounter an X-axis direction force under a magnetic field of a Z-direction and acquire a motion component of an X-axis direction.

FIG. 7 shows a relation among the direction of a magnetic field B, direction of motion of electrons e and sense of a force F which each electron receives.

When the electron acquires an X-axis direction motion component, then it similarly receives a negative Y-axis direction force this time. Consequently, through such a continued operation, the electron is spirally mobilized in the Z-axis direction, while being rotated around the Z-axis direction as shown in FIG. 8. That is, a cyclotron movement is conducted in a magnetic field.

Those magnets 205a and 205b are so arranged as to have their N poles opposed relative to each other with an electron beam path defined therebetween so that the senses of their neighboring lines of magnetic force are as indicated by arrows in FIG. 9.

When the electrons approach that area, since, of the electron motion including a rotation motion component, the Z-axis motion is still dominant, the electrons acquire forces in those directions of arrows in FIG. 10 by the lines of magnetic force as indicated by arrows in FIG. 9 and the electron beam is inclined in a positive X-axis up direction and a negative X-axis down direction as viewed in the Z-axis travel direction as shown in FIG. 11. In this case, this state is obtained in a range as indicated by an arrow B in FIG. 6.

Further, as shown in FIG. 4, the sheet-like plane of the electron beam over the wafer 117 is inclined, in a position past the centers of the magnets 205a and 205b, in a positive X-axis down and a negative X-axis up direction as viewed in the Z-axis direction in which the electron beam travels.

This is due to a reason as will be set out below.

In a position past the centers of the magnets 205a and 205b, a magnetic field is intensified in the Z-axis direction as shown in FIG. 12 and the electrons, moving in the Z-axis direction, are mobilized in a direction of arrows in an electron beam in FIG. 11.

The sheet-like electron beam acquires those forces as indicated by arrows in FIG. 13 and the electron beam is moved, as shown in FIG. 4, in the positive X-axis down and negative X-axis up direction as viewed in the Z-axis direction in which the electron beam travels. When the electrons are moved to some extent, they again start a spiral motion in the Z-axis direction.

Even in a position somewhat separate from the magnets, the electrons continue the Z-axis direction spiral motion, as they are, in a range as indicated by an arrow C in FIG. 6 and, consequently, over the wafer, the sheet-like plane of the electron beam stays inclined, as shown in FIG. 4, in the positive X-axis down and negative X-axis up direction as viewed in the Z-axis direction in which the electron beam travels. When, however, the sheet-like plane of the electron beam 120 set out above is inclined on a right lower side, the lower portion of the electron beam 120 as shown in FIG. 1 collides with a side surface of the susceptor 116 on which the wafer 117 is positioned. That portion of the electron beam fails to contribute to the creation of the plasma.

As a result, a plasma portion in the positive X-axis down direction is more weakened than a plasma portion in the negative X-axis up direction and the rate at which the plasma process is performed is fast in the negative X-axis direction, that is, on the left side of the wafer, and slow in the positive X-axis direction, that is, on the right side of the wafer.

In this way, the rate at which the plasma process is performed on the to-be-processed material is not uniform.

The conventional plasma process performing apparatus and method pose a problem, that is, the drawback that no uniform rate is obtained in performing plasma process on the material to be processed.

SUMMARY OF THE INVENTION

It is accordingly the object of the present invention to provide an apparatus and method for performing plasma process on a to-be-processed material, such as a semiconductor wafer, at a freely controllably, uniformly distributed process rate.

In one aspect of the present invention, there is provide an apparatus for performing plasma process on a to-be-processed material, such as a semiconductor wafer, comprising:

means for drawing an electron beam from an electron source plasma and for accelerating it;

a reaction chamber for receiving the electron beam and for allowing the to-be-processed material to be subjected to process by a sheet-like plasma created;

means for introducing into the reaction chamber a gas undergoing a reaction excited by the electron beam; and at least one pair of magnet means, positioned in the reaction chamber in an opposed relation with an electron beam path set therebetween, for forming a sheet-like electron beam by their magnetic field and for creating the sheet-like plasma through that gas reaction excited by the sheet-like electron beam so that uniform plasma process can be performed at a uniform rate on the to-be-processed material.

According to another aspect of the present invention, there is provided a method for performing plasma process on a material to be processed, such as a semiconductor wafer, comprising the steps of:

(a) drawing an electron beam from an electron source plasma and accelerating it;

(b) introducing the electron beam into a reaction chamber with the material held in place;

(c) introducing into the reaction chamber a gas to be excited by the electron beam through a reaction;

(d) forming a sheet-like electron beam through a magnetic field of at least one pair of magnetic means provided in the chamber in an opposed relation with an electron beam path set therebetween and creating that sheet-like plasma through that gas reaction excited by the sheet-like electron beam; and (e) positioning the at least one pair of magnets so that plasma process is performed on the material at a uniform rate.

In the present apparatus of performing plasma process on the material to be processed, such as a semiconductor wafer, it is possible to enhance the uniform rate with which it is possible to do plasma process on the material.

In the present method of performing plasma process on the material to be processed, such as a semiconductor wafer, the plasma process rate can be adjusted on the material to be processed during plasma process. It is, therefore, possible to perform uniform etching process and deposition process.

BRIEF DESCRIPTION OF THE DRAWINGS

FIG. 2 is a view showing an inlet of a reaction chamber of the conventional apparatus of FIG. 1 and magnets and coils in the reaction chamber;

FIG. 3 shows an inlet of a reaction chamber, as well as an arrangement of magnets and coils in the chamber, of a conventional apparatus for explaining an embodiment for creating a sheet-like plasma with the use of permanent magnets;

FIG. 16 is a view showing one array form of the magnets of FIG. 15 as well as one example of an associated magnetic field in the apparatus of the present invention;

FIG. 17 is a graph showing a variation in the inclination of a sheet-like plane of an electron beam with respect to an amount of total displacement of upper and lower magnets made for sheet-like plane formation according to a method of the present invention;

FIG. 18 is a side view showing a variation in the width of the sheet-like plane of the electron beam with respect to an interval between the upper and lower magnets (FIG. 15) for sheet-like plane formation which is varied in the method of the present invention;

DETAILED DESCRIPTION OF THE PREFERRED EMBODIMENT

An embodiment of the present invention will be explained in detail below with reference to the accompanying drawings.

Figure 1:
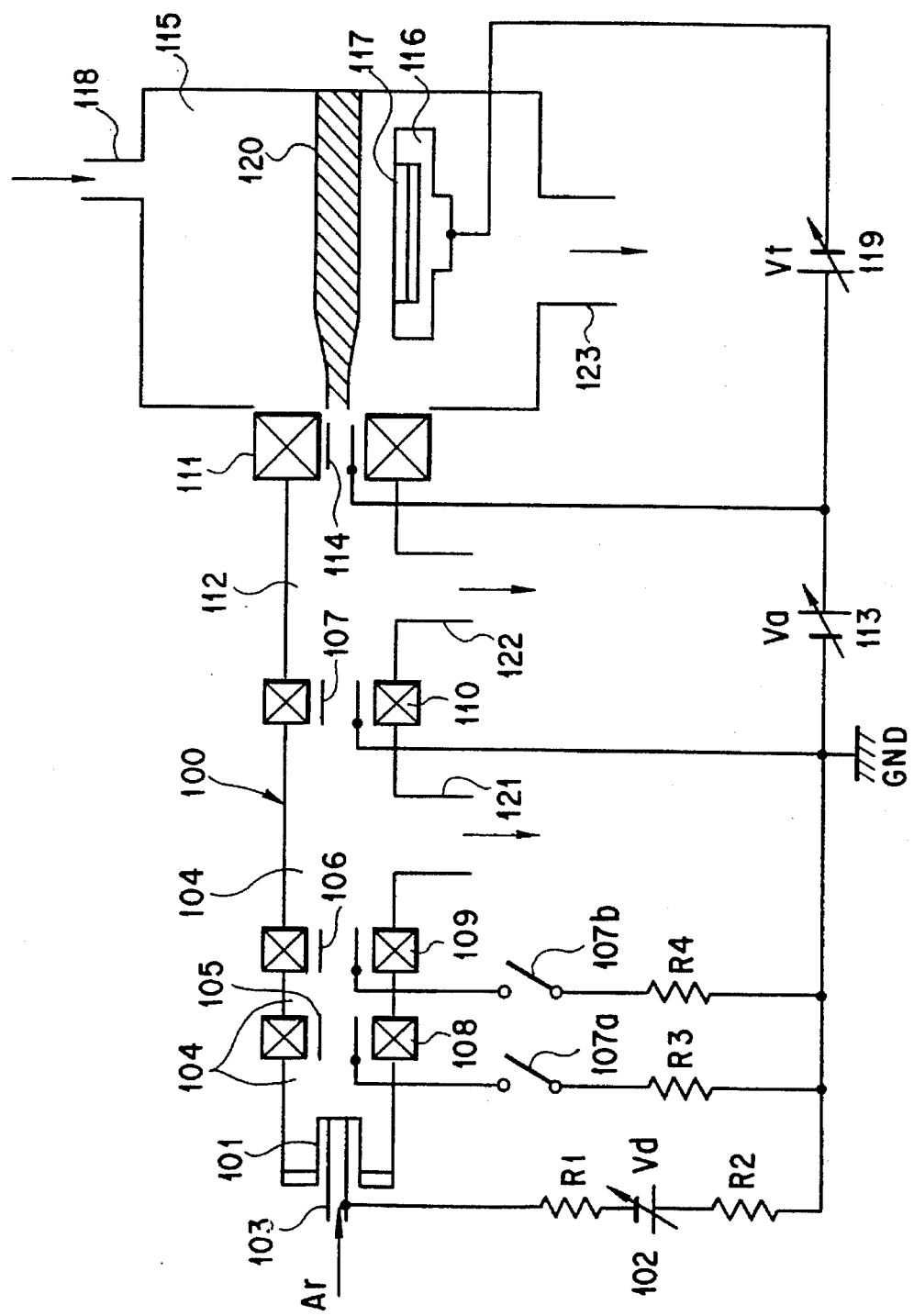
FIG. 1 is a cross-sectional view diagrammatically showing an arrangement of a conventional apparatus for performing plasma process on a to-be-processed material, such as a semiconductor wafer, with the use of an EBEP technique.
Figure 4:
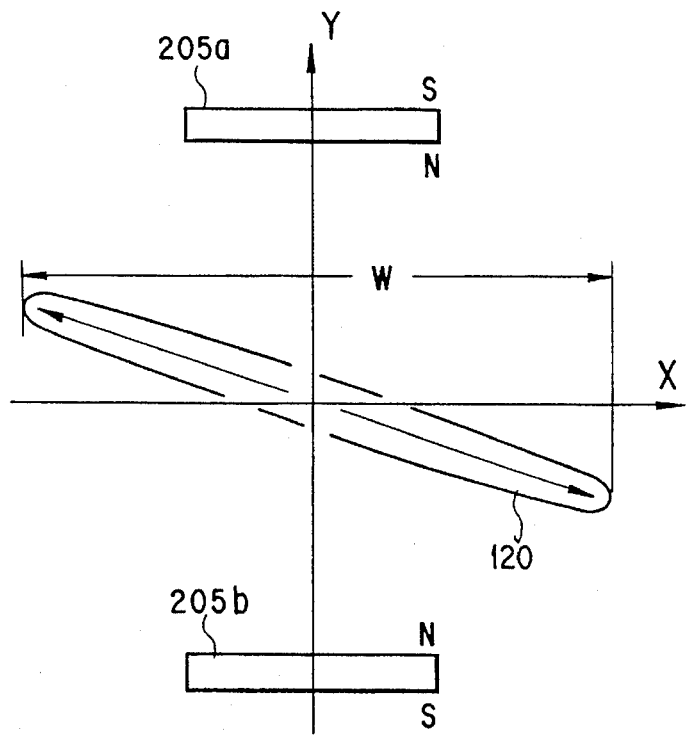
FIG. 4 shows the inclination of a sheet-like beam created in the reaction chamber.
Figure 5:
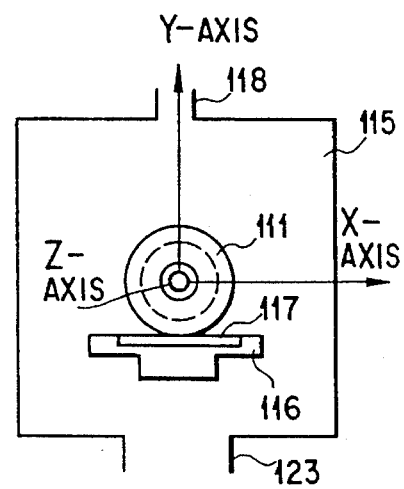
FIG. 5 is a diagrammatic view showing a front side of the reaction chamber as viewed in a direction of travel of an electron beam.
Figure 6:
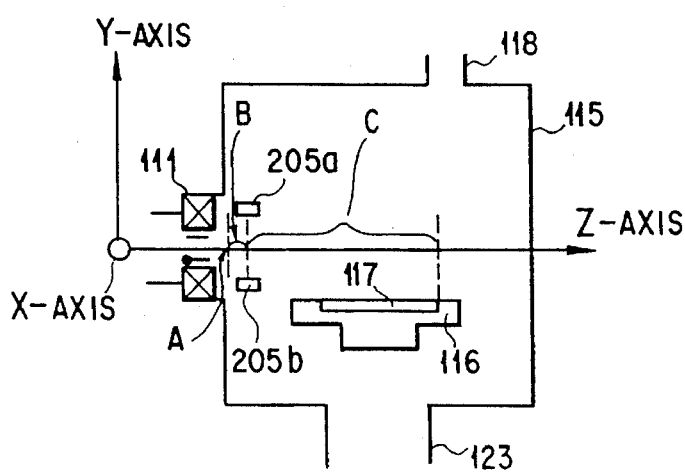
FIG. 6 is a diagrammatic view in side elevation showing the reaction chamber as viewed in the direction of travel of the electronic beam.
Figure 7:
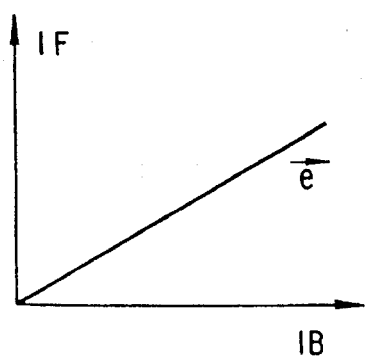
FIG. 7 shows a relation among the direction of a magnetic field, direction of a force received by an electron and direction of a motion of an electron.
Figure 8:
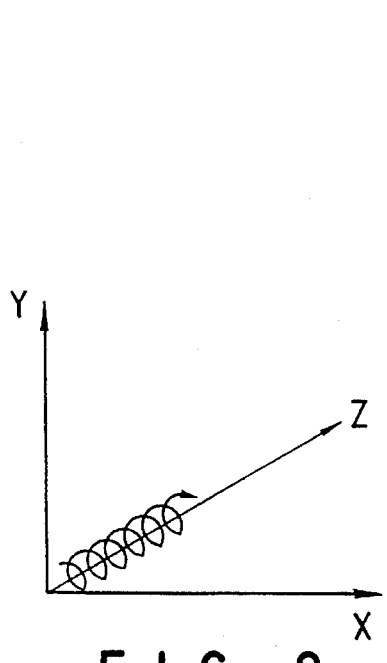
FIG. 8 is a view showing a spiral motion of an electron in a Z-axis direction.
Figure 9:
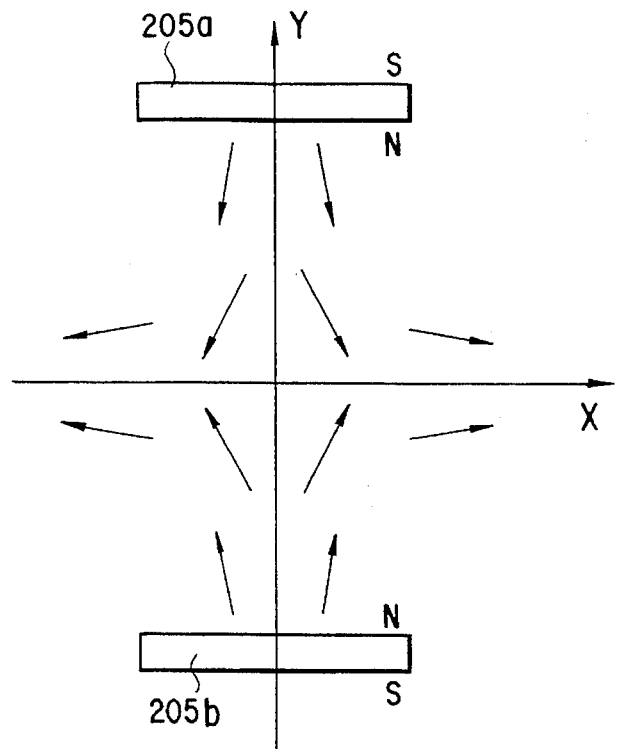
FIG. 9 is a view showing the senses of lines of magnetic force created between opposed permanent magnets.
Figure 10:
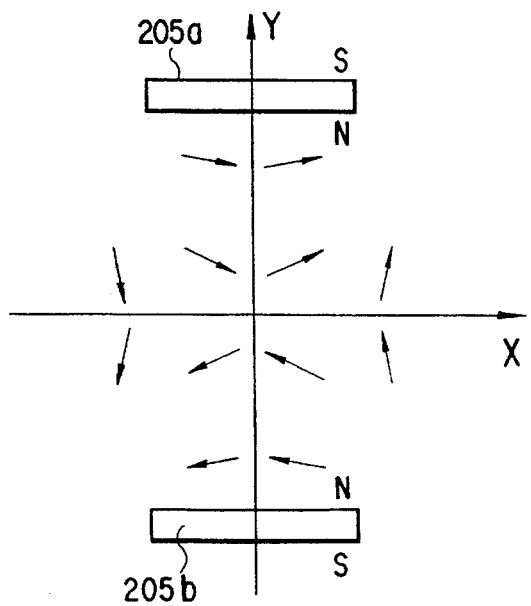
FIG. 10 is a view showing electron forces resulting from the lines of magnetic force of FIG. 9.
Figure 11:
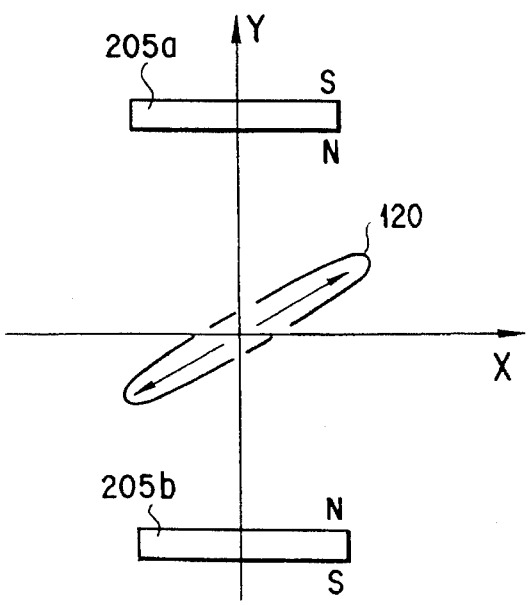
FIG. 11 is a view showing an inclined sheet-like plasma under those forces the electrons undergo as indicated in FIG. 10.
Figure 12:
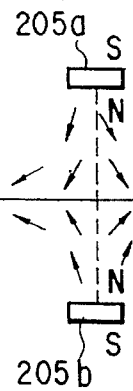
FIG. 12 is an explanatory view showing a magnetic field abruptly intensified in the Z-axis direction at a place past the centers of permanents magnets 205a and 205b.
Figure 13:
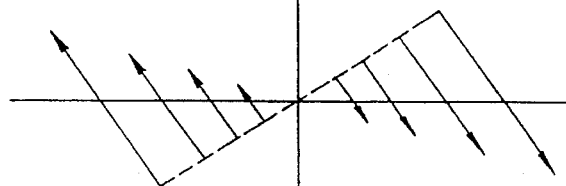
FIG. 13 is a view showing the directions of forces the sheet-like plane of electron beams undergo between permanent magnets.
Figure 14:
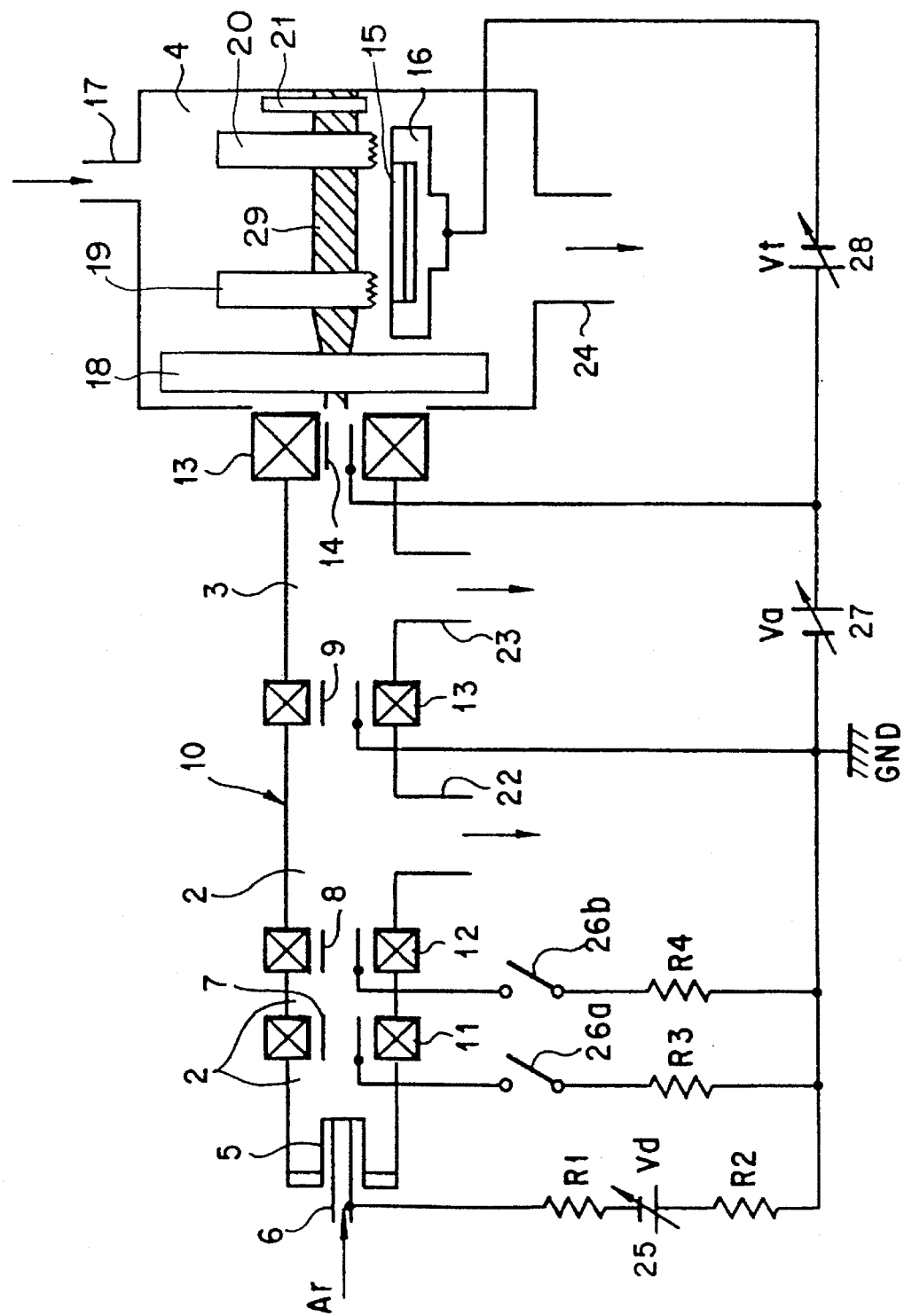
FIG. 14 is a cross-sectional view schematically showing the arrangement of a plasma process-performing apparatus according to one embodiment of the present invention.

As shown in FIG. 14, an apparatus of the present invention is equipped with a chamber (hereinafter referred to as an electron source plasma generation chamber) 2 provided on one end of a hermetically sealed container 10, the chamber generating a plasma serving as an electron source. An electron beam accelerating chamber 3 is provided at an intermediate section of the sealed container 2. A reaction chamber 4 is provided on the other end of the sealed container 10. An inlet 5, electrodes 6, 7, 8 and 9 and annular coils 11, 12 and 13 are provided in the plasma generation chamber 2 in which an inert gas, such as argon (Ar), is introduced via the inlet 5 into the chamber and the annular coils 11, 12, and 13 are used to draw an electron beam.

The annular electrode 11 for introducing the electron beam, as well as an acceleration electrode 14 for accelerating the electron beam, is provided in the acceleration chamber 3.

An inlet 17 for introducing a reaction gas is provided in the reaction chamber 4 in which a susceptor 16 is held with a wafer 15 supported thereon.

Figure 15:
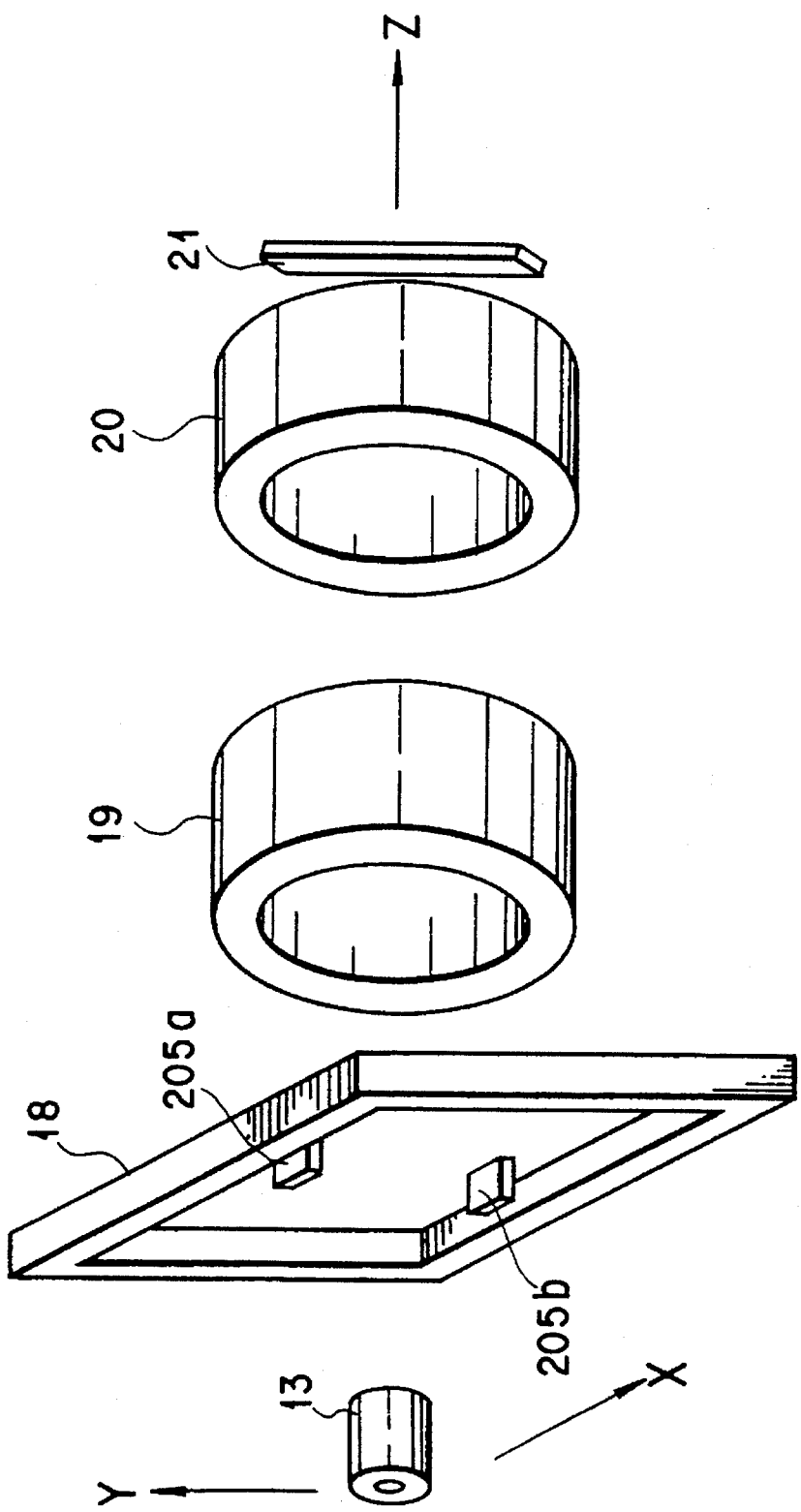
FIG. 15 is a view showing one array form of a magnet and coils at the inlet and interior of a reaction chamber of the apparatus of FIG. 14.

A rectangular coil 18, solenoid coils 19, 20 and a samarium (Sm)-cobalt (Co)-based magnet 21 are arranged in place in the reaction chamber 4 as shown in FIG. 15.

Outlets 22, 23 and 24 are provided in the chambers 2, 3 and 4, respectively, and the respective chambers are evacuated by vacuum pump means to a requisite vacuum level.

An electrode 25 is connected to the electrode 6 to provide a required voltage. A switch 26a is connected to the electrode 7 for selective connection to a reference potential GND. A switch 26b is connected to the electrode 8 for selective connection to the reference potential GND. In an arrangement shown in FIG. 14, R1 to R4 shown resistors.

A power supply 27 is connected to the acceleration electrode 14 to apply a required acceleration voltage 14 there. A power supply 28 is connected to the susceptor 16 to provide a required bias voltage Vt.

By the above-mentioned arrangement it is possible to generate an electron source plasma at the plasma generation chamber 2, to draw an electron beam from the electron source plasma, to accelerate it at the acceleration electrode 14 and to guide the electron beam into the reaction chamber 4 via an annular coil 13.

In the reaction chamber 4, a reaction gas introduced via the reaction gas inlet 17 is excited by an electron beam 29 to provide a plasma whereby it is possible to perform plasma process on the wafer 15.

FIG. 16 shows one practical array of opposed permanent magnets 205a, 205b (see FIG. 15) as well as the senses of magnetic lines of force created between these permanent magnets.

The permanent magnets 205a, 205b are one pair of Sm-Co-based permanent magnets comprised of a rectangular parallellpiped of 40 mm in width (X-axis direction dimension)×15 mm in length (Z-axis direction dimension)×6 mm in thickness (Y-axis direction dimension). These permanent magnets are arranged, at an interval of 80 mm, with their magnetization oriented in the thickness direction and have their N poles opposed relative to each other with an electron beam path created therebetween.

In this embodiment, the electrodes 205a, 205b are displaced in the mutually opposite directions, as shown in FIG. 16, as viewed in the X-axis direction and the magnetic lines of force are as indicated by arrows in FIG. 16. By varying the extent of the X-axis direction displacement of the permanent magnets, the inclination of the sheet-like plane of the electron beam is correspondingly varied as shown in FIG. 17.

In the case where the permanent magnets 205a and 205b are displaced by a total of 4 mm for instance, that is, the upper- and lower-side permanent magnets 205a and 205b by 2 mm in a negative and a positive X-axis direction, respectively, as viewed in the Z-axis direction in which the electron beam travels, the sheet-like plane of the electron beam becomes substantially horizontal.

Further, it has been confirmed that, even if upper and lower permanent magnets 205a and 205b made of a 60 mm wide, 20 mm long×6 mm thick Sm-Co-based permanent magnet are arranged, at an interval of 80 mm, with an electron beam path created therebetween, and displaced by a total of 6 mm, that is, by 3 mm in the negative X-axis left and positive X-axis right direction, respectively, the sheet-like plane of the electron beam becomes substantially horizontal.

Stated in another way, according to the present embodiment above, it is possible to make the sheet plane of the electron beam horizontal to the surface of the wafer through the ingenious relative positioning of the permanent magnets 205a and 205b.

It is, therefore, possible to perform plasma process on the wafer surface at a uniform rate and perform uniform plasma process which could not otherwise be achieved at a conventional plasma process rate with one pair of permanent magnets simply oppositely arranged in a not-displaced relation. Although the permanent magnets have been explained as having their N poles oriented relative to each other with the electron beam path created therebetween, the present invention is not restricted thereto. For example, the paired permanent magnets have their S poles oriented relative to each other in that direction (X-axis direction) perpendicular to the direction (Y-axis direction) in which these permanent magnets are oppositely arranged in the above embodiment. It is also possible to arrange those paired permanent magnets with the N poles of one corresponding pair faced and S poles of another corresponding pair faced relative to each other.

Further, both the magnets, being varied in extent of their displacement, lead to a variation in the inclination of the sheet-like plane of the electron beam and, being varied in their interval, lead to a variation in the width (indicated by W in FIG. 18) of the sheet-like plasma. If, therefore, no adequate uniformity is obtained simply by making the sheet-like plane of the electron beam horizontal, it is possible to gain an adequate uniformity by adjusting the extent of displacement and interval of the permanent magnets.

FIG. 18 shows a relation of the displacement of 40 mm wide×15 mm long×6 mm thick Sm-Co-based permanent magnets 205a and 205b with their poles oriented in the thickness direction to the width W of the sheet-like plane of an electron beam.

The extent of displacement and interval of both the permanent magnets can be varied by a relatively easy mechanical action. It is, therefore, possible to readily enhance the uniformity as already set out above.

According to the plasma process method above, the inclination and width of the sheet-like electron beam can be varied during the process and it is possible to uniformly perform plasma process on the wafer.

Adusting the extend of displacement and interval of the permanent magnets can be achieved through the following moving mechanism when the permanent magnets are employed.

Figure 19:
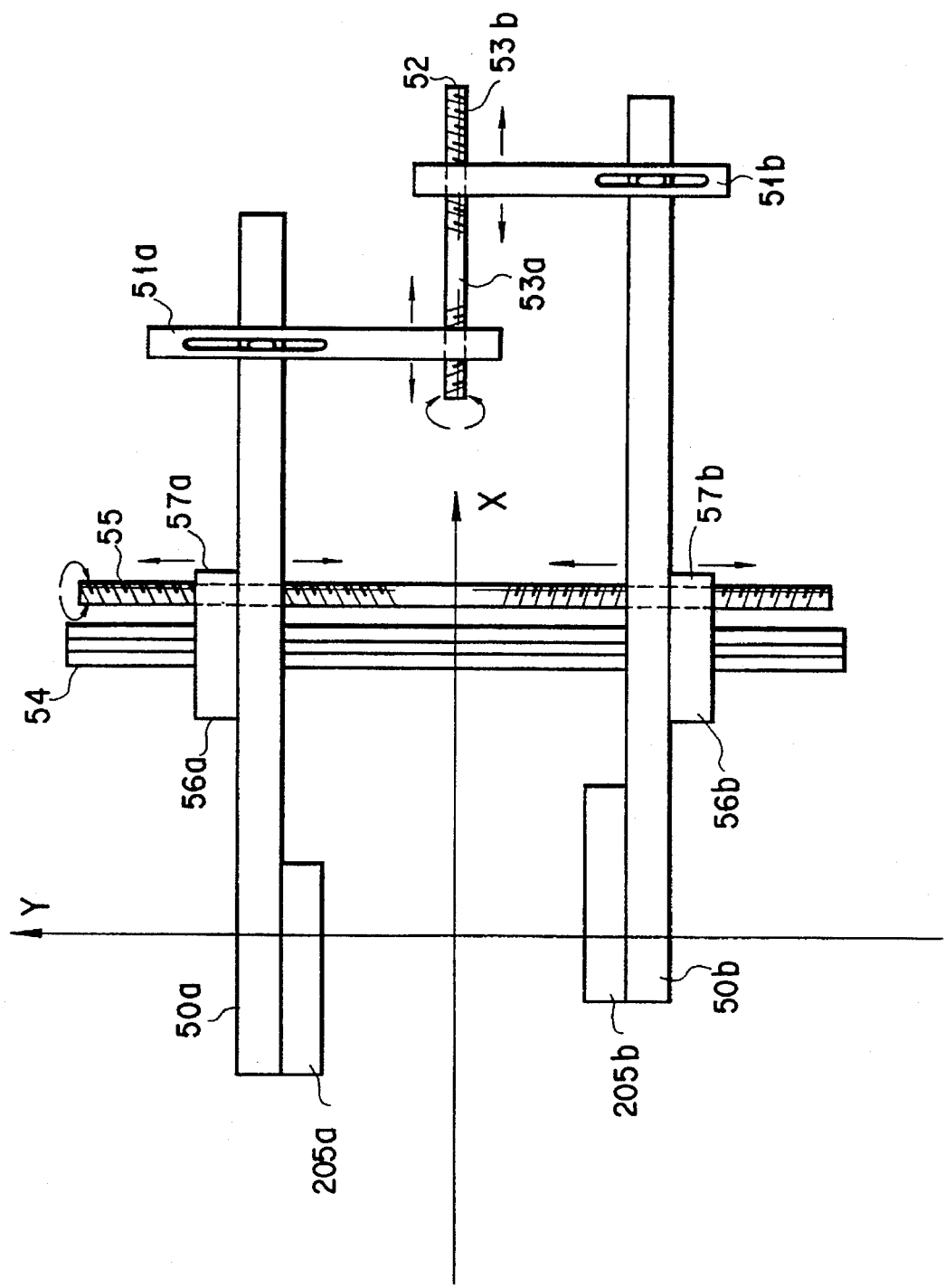
FIG. 19 is a view showing a mechanism for displacing opposed permanent magnets (magnets for sheet-like plane formation) in a Z-axis direction, as well as a mechanism for displacing an interval between the opposed permanent magnets, according to the method of the present invention.

As shown in FIG. 19, for example, the permanent magnets 205a and 205b are supported on one end sides of support rods 50a and 50b, respectively, and guide rods 51a and 51b are mounted by a magnet displacement adjusting gear 52 to the other end sides of the support rods 50a and 50b in a direction perpendicular to these support rods, that is, to the other end sides remote from the permanent magnets 205a and 205b.

The magnet displacement adjusting gear 52 has mutually oppositely threaded sections. With the rotation of the magnet displacement adjusting gear 52, the support rods 50a and 50b are moved, by the guide rods 51a and 51b, in mutually opposite directions, that is, in a positive X-axis and negative X-axis direction so that it is possible to adjust the extent of displacement between the permanent magnets 205a and 205b.

On the other hand, the interval between the opposed permanent magnets 205a and 205b is adjusted by rotating a magnet interval adjusting gear 55. The support rods 50a and 50b are fixed to guide rails 56a and 56b, respectively. The guide rails 56a and 56b, each, have a projection at their middle area which is slidably fitted in the associated recess of the guide rail 54. The magnet interval adjusting gear 55 is threaded in the guide rails 56a and 56b.

The magnet interval adjusting gear 55 has mutually oppositely threaded sections 57a and 57b. With the rotation of the magnet interval adjusting gear 55, the guide rails 56a and 56b slide with their projections fitted in the associated recess of the guide rail 54 to enable the support rods 50a and 50b to be moved in their opposite directions, that is, one in the positive Y-axis direction and the other in the negative Y-axis direction, so that the interval between the permanent magnets 205a and 205b can be adjusted. It is, thus, possible to adjust the extent of displacement and interval of the permanent magnets 205a and 205b separately.

Although, as set out above, the permanent magnets have been explained in connection with the present embodiment, the inclination and width of a sheet-like electron beam surface can be varied during plasma process, by electromagnets, in place of moving the position of the permanent magnets.

Figure 20:
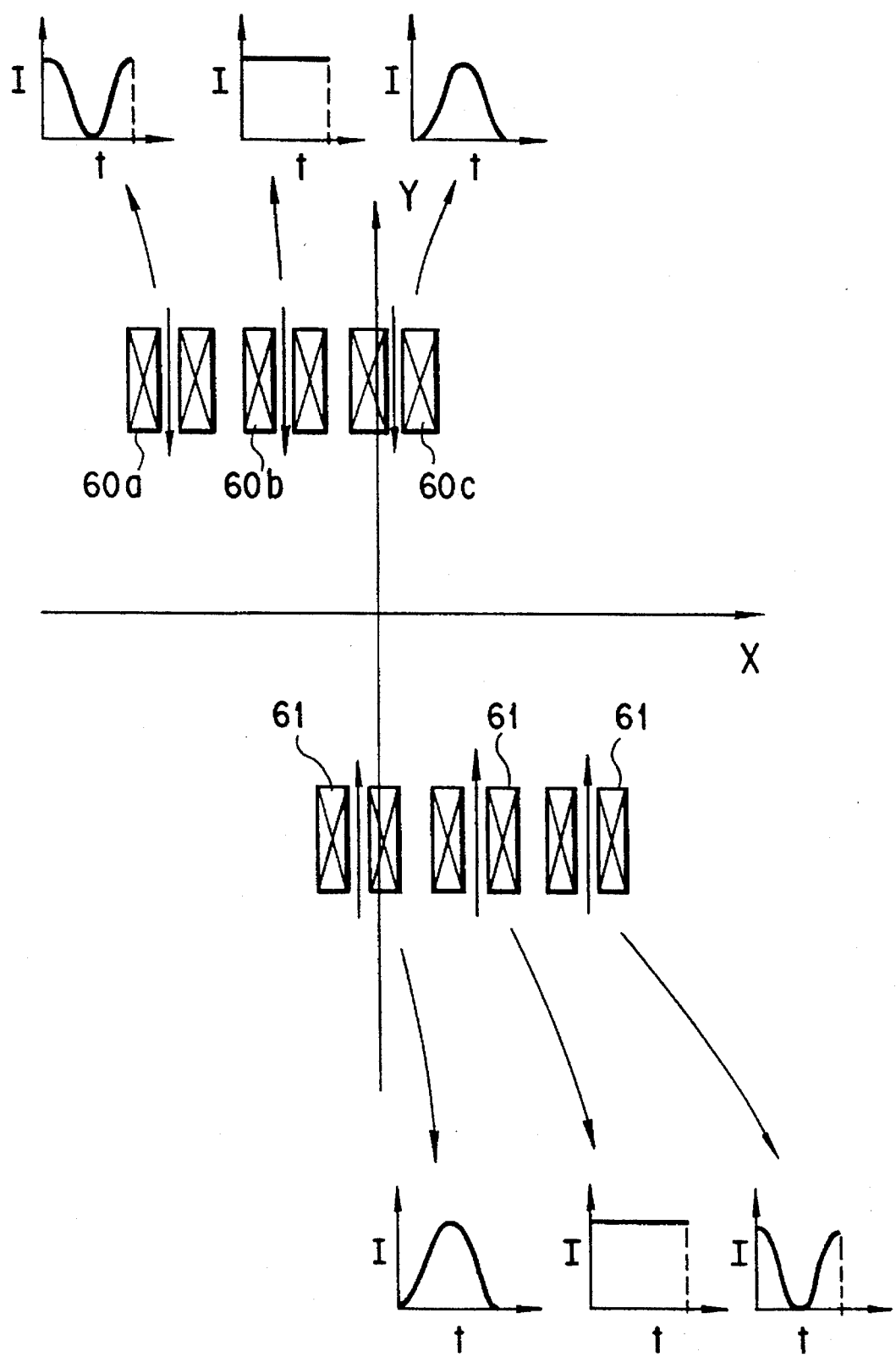
FIG. 20 is an explanatory view for explaining an embodiment for using electromagnets in place of the opposed permanent magnets in FIG. 19 and also explaining the senses of forces those electrons arriving between the opposed magnets undergo.

As shown in FIG. 20, for example, electromagnets 60a, 60b and 60c can be fixedly arranged relative to electromagnets 61a, 61b and 61c and, in this case, the sheet-like electron beam has its predetermined inclination and width achieved during plasma process by determining the currents in these electromagnets with respect to the corresponding times as shown in FIG. 20.

In the case where the material to be processed is subject to a variation, it is possible to achieve uniform plasma process by adjusting the current levels against such a variation.

Although, in the aforementioned embodiment, the material to be processed has been explained as being the aforementioned semiconductor wafer, the present invention is not restricted thereto. For example, the same process as in the aforementioned embodiment can be applied to a reticule for exposure, etc., of an LCD (liquid crystal device) substrate and semiconductor chip.

The plasma process of the present apparatus and method is applicable to various plasma processes in a dry etching, CVD, sputtering, etc.

What is claimed is:

1. An apparatus for performing plasma process on a semiconductor wafer or other material to be processed, comprising:

means for drawing an electron beam from an electron source plasma and for accelerating it;

a reaction chamber for receiving the electron beam and for allowing the to-be-processed material to be subjected to process by a created sheet-like plasma;

means for introducing into the reaction chamber a gas undergoing a reaction excited by the electron beam; and at least one pair of magnet means, positioned in the reaction chamber in an opposed spaced relation with an electron beam path set therebetween, for forming a sheet-like electron beam by their magnetic field and for creating the sheet-like plasma through a gas reaction excited by the sheet-like electron beam so that a uniform plasma process can be performed at a uniform rate on the to-be-processed material wherein, in a solid reference plane extending perpendicularly from a Z-axis corresponding to a center line of the electron beam path, the at least one pair of magnet means, while maintaining a spacing at a value in a direction parallel to a Y-axis direction which is right-angled relative to the Z-axis direction, are positioned in a direction parallel to an X-axis direction and in opposed relation on opposite sides of the X-axis, which is right-angled relative to the Z-axis direction and the Y-axis direction.

2. The apparatus according to claim 1, wherein the at least one pair of magnet means comprises electromagnet means.

3. The apparatus according to claim 2, wherein the magnet means are comprised of a plurality of parallel electromagnets, the electromagnets being so arranged that, by varying their current levels with respect to respective energization times for the electromagnets, the shape and position of the sheet-like plasma are controlled relative to the material so as to achieve uniform plasma process on the material.

* * * * *